United States Patent
Manning

(10) Patent No.: US 10,643,673 B2
(45) Date of Patent: May 5, 2020

(54) APPARATUSES AND METHODS FOR PERFORMING COMPARE OPERATIONS USING SENSING CIRCUITRY

(71) Applicant: Micron Technology, Inc., Boise, ID (US)

(72) Inventor: Troy A. Manning, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 10 days.

(21) Appl. No.: 16/105,543

(22) Filed: Aug. 20, 2018

(65) Prior Publication Data
US 2018/0358058 A1  Dec. 13, 2018

Related U.S. Application Data

(63) Continuation of application No. 15/692,376, filed on Aug. 31, 2017, now Pat. No. 10,056,122, which is a (Continued)

(51) Int. Cl.
*G11C 7/06* (2006.01)
*G11C 7/10* (2006.01)
(Continued)

(52) U.S. Cl.
CPC .............. *G11C 7/065* (2013.01); *G11C 7/06* (2013.01); *G11C 7/062* (2013.01); *G11C 7/10* (2013.01);
(Continued)

(58) Field of Classification Search
CPC .................................. G11C 7/062; G11C 7/065
(Continued)

(56) References Cited

U.S. PATENT DOCUMENTS 4,380,046 A   4/1983 Fung
4,435,792 A   3/1984 Bechtolsheim
(Continued)

FOREIGN PATENT DOCUMENTS

CN   102141905   8/2011
EP     0214718   3/1987
(Continued)

OTHER PUBLICATIONS

Supplementary European Search Report and Written Opinion for EP Application No. 14829677.5, dated Mar. 1, 2017, 8 pages.
(Continued)

*Primary Examiner* — Son L Mai
(74) *Attorney, Agent, or Firm* — Brooks, Cameron & Huebsch, PLLC

(57) ABSTRACT

The present disclosure includes apparatuses and methods related to performing compare and/or report operations using sensing circuitry. An example method can include charging an input/output (IO) line of a memory array to a voltage. The method can include determining whether data stored in the memory array matches a compare value. The determination of whether data stored matches a compare value can include activating a number of access lines of the memory array. The determination can include sensing a number of memory cells coupled to the number of access lines. The determination can include sensing whether the voltage of the IO line changes in response to activation of selected decode lines corresponding to the number of memory cells.

18 Claims, 4 Drawing Sheets

Related U.S. Application Data continuation of application No. 15/287,980, filed on Oct. 7, 2016, now Pat. No. 9,799,378, which is a continuation of application No. 14/603,850, filed on Jan. 23, 2015, now Pat. No. 9,466,340, which is a continuation of application No. 13/952,054, filed on Jul. 26, 2013, now Pat. No. 8,964,496.

(51) Int. Cl.
  *G11C 11/4091* (2006.01)
  *G11C 11/4096* (2006.01)
  *G11C 15/04* (2006.01)
  *G11C 7/12* (2006.01)

(52) U.S. Cl.
  CPC .......... *G11C 7/1006* (2013.01); *G11C 7/1048* (2013.01); *G11C 7/12* (2013.01); *G11C 11/4091* (2013.01); *G11C 11/4096* (2013.01); *G11C 15/043* (2013.01)

(58) Field of Classification Search
  USPC .................................................. 365/189.07
  See application file for complete search history.

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,381,367 A | 1/1995 | Kajimoto |
| 5,386,379 A | 1/1995 | Ali-Yahia et al. |
| 5,398,213 A | 3/1995 | Yeon et al. |
| 5,404,338 A | 4/1995 | Murai et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,535,161 A | 7/1996 | Kato |
| 5,598,372 A | 1/1997 | Matsumoto et al. |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,715,209 A | 2/1998 | Yoo |
| 5,724,291 A | 3/1998 | Matano |
| 5,724,366 A | 3/1998 | Furutani |
| 5,751,987 A | 5/1998 | Mahant-Shetti et al. |
| 5,761,146 A | 6/1998 | Yoo et al. |
| 5,787,458 A | 7/1998 | Miwa |
| 5,822,268 A | 10/1998 | Kirihata |
| 5,854,636 A | 12/1998 | Watanabe et al. |
| 5,867,429 A | 2/1999 | Chen et al. |
| 5,870,504 A | 2/1999 | Nemoto et al. |
| 5,877,990 A | 3/1999 | Kim |
| 5,915,084 A | 6/1999 | Wendell |
| 5,935,263 A | 8/1999 | Keeth et al. |
| 5,949,732 A | 9/1999 | Kirihata |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,061,808 A | 5/2000 | Yamauchi et al. |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,487,132 B2 | 11/2002 | Bae |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,180,817 B2 | 2/2007 | Mochida |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |

(56) References Cited

U.S. PATENT DOCUMENTS

| | | |
|---|---|---|
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,441,828 B2 | 5/2013 | Watanabe |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 10,056,122 B2 * | 8/2018 | Manning ............... G11C 7/1006 |
| 2001/0007112 A1 | 7/2001 | Porterfield |
| 2001/0008492 A1 | 7/2001 | Higashiho |
| 2001/0010057 A1 | 7/2001 | Yamada |
| 2001/0015929 A1 | 8/2001 | Bae et al. |
| 2001/0028584 A1 | 10/2001 | Nakayama et al. |
| 2001/0043089 A1 | 11/2001 | Forbes et al. |
| 2002/0001251 A1 | 1/2002 | Fujino et al. |
| 2002/0059355 A1 | 5/2002 | Peleg et al. |
| 2003/0167426 A1 | 9/2003 | Slobodnik |
| 2003/0206463 A1 | 11/2003 | Fujino et al. |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0134713 A1 | 5/2015 | Wheeler |
| 2015/0324290 A1 | 11/2015 | Leidel |
| 2015/0325272 A1 | 11/2015 | Murphy |

FOREIGN PATENT DOCUMENTS

| | | |
|---|---|---|
| EP | 2026209 | 2/2009 |
| FR | 2817996 | 6/2002 |
| JP | S63228498 | 9/1988 |
| JP | H0317893 | 1/1991 |
| JP | H0689575 | 3/1994 |

(56) References Cited

FOREIGN PATENT DOCUMENTS

| | | |
|---|---|---|
| JP | H0831168 | 2/1996 |
| JP | H0845269 | 2/1996 |
| JP | H1196772 | 4/1999 |
| JP | 2003331598 | 11/2003 |
| JP | 2011034636 | 2/2011 |
| JP | 2012104194 | 5/2012 |
| JP | 2013065374 | 4/2013 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Matsunaga, et al., "Implementation of a Perpendicular MTJ-Based Read-Disturb-Tolerant 2T-2R TCAM Based on a Reversed Current Reading Scheme", 2012 17th Asia and South Pacific Design Automation Conference, Jan. 30-Feb. 2, 2012, pp. 475-476, (2 pgs.).
Notice of Rejection for related Korea Patent Application No. 10-2016-7029643, dated Sep. 8, 2017, 8 pages.
Boyd et al., "On the General Applicability of Instruction-Set Randomization", Jul.-Sep. 2010, (14 pgs.), vol. 7, Issue 3, IEEE Transactions on Dependable and Secure Computing.
Stojmenovic, "Multiplicative Circulant Networks Topological Properties and Communication Algorithms", (25 pgs.), Discrete Applied Mathematics 77 (1997) 281-305.
"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
Debnath, Biplob, Bloomflash: Bloom Filter on Flash-Based Storage, 2011 31st Annual Conference on Distributed Computing Systems, Jun. 20-24, 2011, 10 pgs.
Pagiamtzis, Kostas, "Content-Addressable Memory Introduction", Jun. 25, 2007, (6 pgs.), retrieved from: http://www.pagiamtzis.com/cam/camintro.
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
International Search Report and Written Opinion for PCT Application No. PCT/US2013/043702, dated Sep. 26, 2013, (11 pgs.).
Elliot, et al., "Computational RAM: Implementing Processors in Memory", Jan.-Mar. 1999, (10 pgs.), vol. 16, Issue 1, IEEE Design and Test of Computers Magazine.
Dybdahl, et al., "Destructive-Read in Embedded DRAM, Impact on Power Consumption," Apr. 2006, (10 pgs.), vol. 2, Issue 2, Journal of Embedded Computing—Issues in embedded single-chip multicore architectures.
Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.
Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory as a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).

* cited by examiner

APPARATUSES AND METHODS FOR PERFORMING COMPARE OPERATIONS USING SENSING CIRCUITRY

PRIORITY INFORMATION

This application is a Continuation of U.S. application Ser. No. 15/692,376, filed Aug. 31, 2017, which issues as U.S. Pat. No. 10,056,122 on Aug. 21, 2018, which is a Continuation of U.S. application Ser. No. 15/287,980, filed Oct. 7, 2016, which issued as U.S. Pat. No. 9,799,378 on Oct. 24, 2017, which is a Continuation of U.S. application Ser. No. 14/603,850, filed Jan. 23, 2015, which issued as U.S. Pat. No. 9,466,340 on Oct. 11, 2016, which is a Continuation of U.S. application Ser. No. 13/952,054, filed Jul. 26, 2013, which issued as U.S. Pat. No. 8,964,496 on Feb. 24, 2015, the contents of which are included herein by reference.

TECHNICAL FIELD

The present disclosure relates generally to semiconductor memory and methods, and more particularly, to apparatuses and methods related to performing compare operations using sensing circuitry.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR logical operations on data (e.g., one or more operands). For example, the functional unit circuitry (FUC) may be used to perform arithmetic operations such as addition, subtraction, multiplication, and/or division on operands.

A number of components in an electronic system may be involved in providing instructions to the FUC for execution. The instructions may be generated, for instance, by a processing resource such as a controller and/or host processor. Data (e.g., the operands on which the instructions will be executed) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the instructions and/or data may also be sequenced and/or buffered.

Executing instructions (e.g., as part of program execution) can involve performing operations such as compare operations and the results can be provided (e.g., reported) to the processing resources as part of the executional flow of an algorithm, for example. Such compare and report functionality can enable, for instance, "if-then-else" programmatic flow, which is often part of program execution.

DETAILED DESCRIPTION

Figure 1:
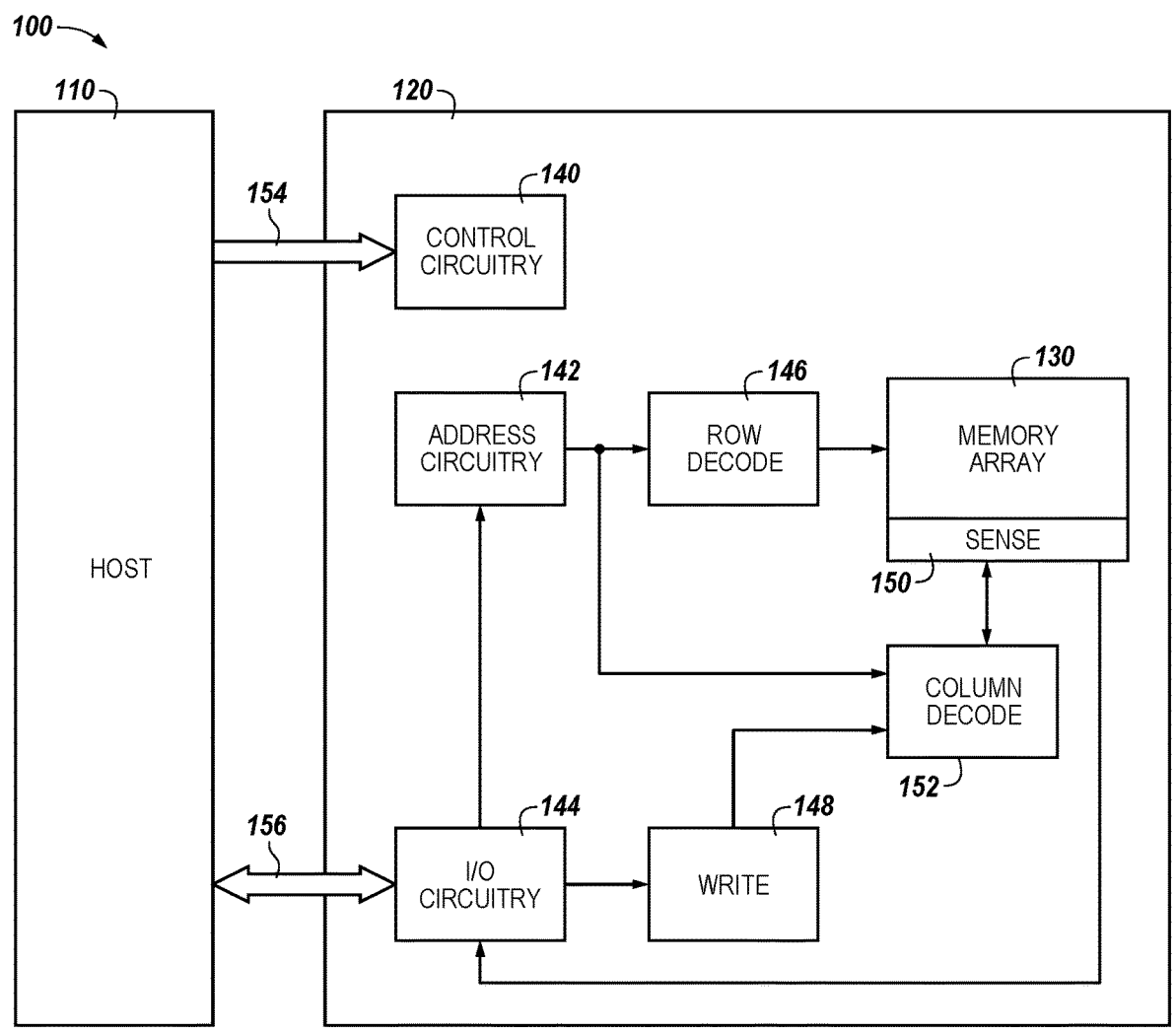
FIG. 1 is a block diagram of an apparatus in the form of a computing system including a memory device in accordance with a number of embodiments of the present disclosure.

The present disclosure includes apparatuses and methods related to performing compare operations using sensing circuitry. An example method comprises charging (e.g., precharging) an input/output (IO) line (e.g., a local IO line (LIO line)) of a memory array to a pvoltage (e.g., a precharge voltage). The method can include determining whether data stored in the memory array matches a compare value by activating a number of access lines of the memory array and sensing a number of memory cells coupled to the number of access lines. The method can include sensing whether the voltage (e.g., precharge voltage) of the LIO line changes in response to activation of selected decode lines (e.g., column decode lines) corresponding to the number of memory cells. In the present disclosure, a "line" is meant to refer to an operable coupling between at least two nodes.

A number of embodiments of the present disclosure can provide benefits such as improved compare and report functionality in association with determining whether a match exists between a compare value (e.g., a particular data value and/or set of data values) and a data value stored in a memory array. For instance, a number of embodiments can provide for identifying whether particular data is stored in a number of memory cells without transferring data out of the memory array and sensing circuitry via a bus (e.g., data bus, address bus, control bus), for instance. The determination of whether data stored in the array matches the compare value can be reported, for instance, to control circuitry (e.g., to an on-die controller and/or to an external host). The determination of whether data stored in the array matches the compare value can be reported into the memory array. Such compare and report functionality can be associated with performing a number of logical operations (e.g., AND, NOT, NOR, NAND, XOR, etc.). However, embodiments are not limited to these examples.

Also, circuitry such as FUC associated with various processing resource(s) may not conform to pitch rules associated with a memory array. For example, the cells of a memory array may have a $4F^2$ or $6F^2$ cell size, where "F" is a feature size corresponding to the cells. The devices (e.g., logic gates) associated with FUC of previous systems may not be capable of being formed on pitch with the memory cells, which can affect chip size and/or memory density, for example.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N," "P," "R," etc., particularly with respect to reference numerals in the drawings, can indicate that a number of the particular features so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 130 may reference element "30" in FIG. 1, and a similar element may be referenced as 230 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled to memory device 120, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as row lines, word lines or select lines) and columns coupled by sense lines (which may be referred to herein as digit lines or data lines). Although a single array 130 is shown in FIG. 1, embodiments are not so limited. For instance, memory device 120 may include a number of arrays 130 (e.g., a number of banks of DRAM cells). An example DRAM array is described in association with FIGS. 2 and 3.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Control circuitry 140 decodes signals provided by control bus 154 from the host 110. These signals can include chip enable signals, write enable signals, and address latch signals that are used to control operations performed on the memory array 130, including data read, data write, and data erase operations. In various embodiments, the control circuitry 140 is responsible for executing instructions from the host 110. The control circuitry 140 can be a state machine, a sequencer, or some other type of controller (e.g., an on-die controller).

An example of the sensing circuitry 150 is described further below in association with FIGS. 2 and 3. For instance, in a number of embodiments, the sensing circuitry 150 can comprise a number of sense amplifiers (e.g., sense amplifiers 206-1, . . . , 206-P shown in FIG. 2 or sense amplifier 306 shown in FIG. 3) and a number of compute components (e.g., compute component 331 shown in FIG. 3), which may comprise an accumulator and can be used to perform compare and report operations (e.g., on data associated with complementary sense lines). In a number of embodiments, the sensing circuitry (e.g., 150) can be used to perform compare and report operations using data stored in array 130 as inputs and store the results of the logical operations back to the array 130 without transferring via a sense line address access (e.g., without firing a column decode signal). As such, various compute functions can be performed within array 130 using sensing circuitry 150 rather than being performed by processing resources external to the sensing circuitry (e.g., by a processor associated with host 110 and/or other processing circuitry, such as ALU circuitry, located on device 120 (e.g., on control circuitry 140 or elsewhere)). In various previous approaches, data associated with an operand, for instance, would be read from memory via sensing circuitry and provided to external ALU circuitry via local I/O lines. The external ALU circuitry would perform compute functions using the operands and the result would be transferred back to the array via the local I/O lines. In contrast, in a number of embodiments of the present disclosure, sensing circuitry (e.g., 150) can be configured to perform logical operations on data stored in memory (e.g., array 130) and store the result to the memory without enabling a local I/O line coupled to the sensing circuitry.

Figure 2:
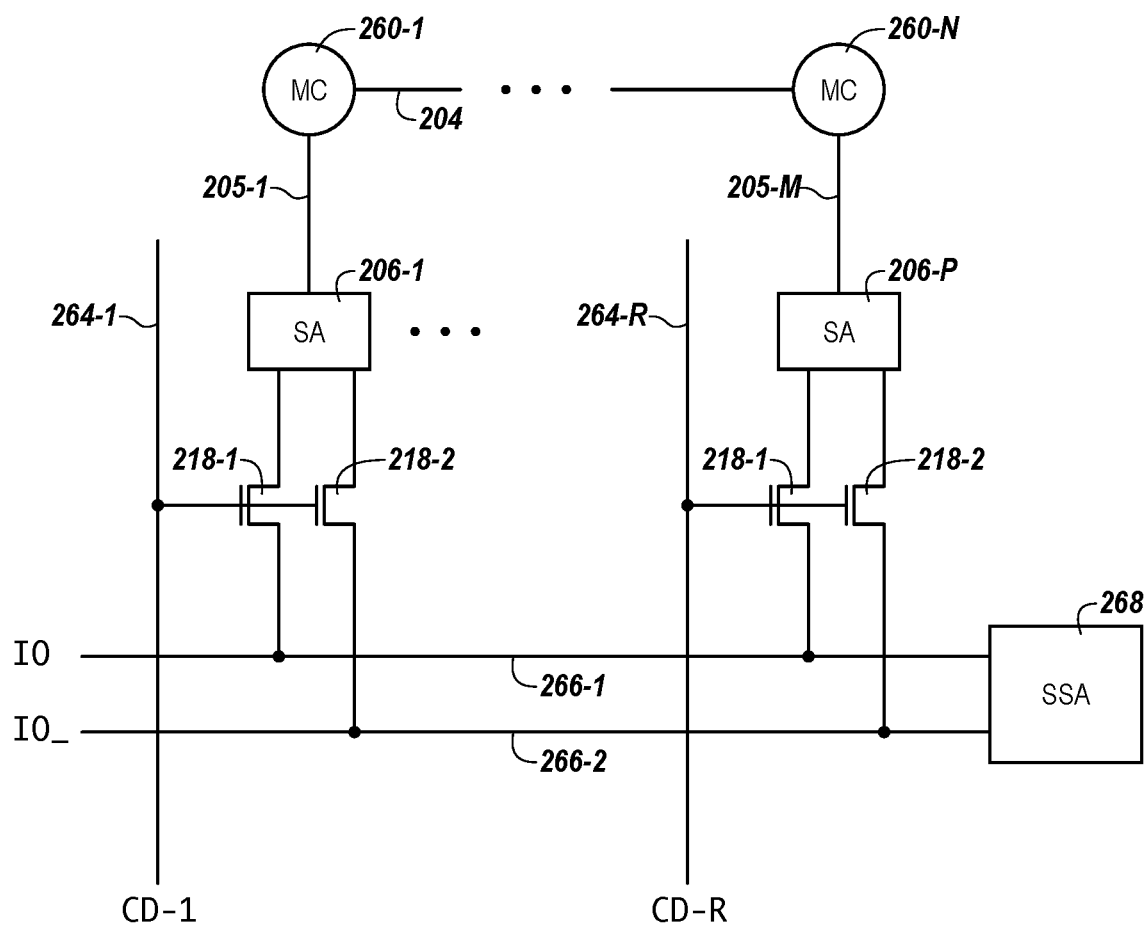
FIG. 2 illustrates a schematic diagram of a portion of a memory array coupled to sensing circuitry in accordance with a number of embodiments of the present disclosure.

FIG. 2 illustrates a schematic diagram of a portion of a memory array coupled to sensing circuitry in accordance with a number of embodiments of the present disclosure. In this example, the memory array is a DRAM array of memory cells (MCs) 260-1, . . . , 260-N. In a number of embodiments, the memory cells are destructive read memory cells (e.g., reading the data stored in the cell destroys the data such that the data originally stored in the cell is refreshed after being read). The memory cells 260-1, . . . , 260-N of the array in FIG. 2 can be arranged in a number of rows coupled by word line 204 and columns coupled by sense lines (e.g., digit lines) 205-1, . . . , 205-M. For ease of reference, the sense lines 205-1, . . . , 205-M represent respective pairs of complementary sense lines (e.g., 305-1 and 305-2 in FIG. 3). Although only one row and two columns of memory cells are illustrated in FIG. 2, embodiments are not so limited. For instance, a particular array may have a number of columns of memory cells and/or sense lines (e.g., 4,096, 8,192, 16,384, etc.). As an example, a gate of a particular memory cell transistor (e.g., 302 in FIG. 3) can be coupled to its corresponding word line (204), a source/drain region can be coupled to its corresponding sense line (e.g., 205-1), and a second source/drain region of a particular memory cell transistor can be coupled to its corresponding capacitor (e.g., 303 in FIG. 3).

The array in FIG. 2 can be coupled to sensing circuitry in accordance with a number of embodiments of the present disclosure. In this example, the sensing circuitry comprises sense amplifiers 206-1, . . . , 206-P and secondary sense amplifier (SSA) 268. The sensing circuitry can be sensing circuitry 150 shown in FIG. 1. The sense amplifiers 206-1 to 206-P are coupled to the respective sense lines 205-1 to 205-M. The sense amplifiers 206-1 to 206-P can be sense amplifiers such as sense amplifier 306 described below in association with FIG. 3. The sense amplifiers 206-1 to 206-P are coupled to input/output lines 266-1 (IO) and 266-2 (IO_) via transistors 218-1 and 218-2, respectively. Column decode lines 264-1 (CD-1) to 264-R (CD-R) are coupled to the gates of transistors 218-1 and 218-2 and can be selectively activated to transfer data sensed by respective sense amps 206-1 to 206-P to the SSA 268 via IO lines 266-1 and 266-2

In operation, sense amps (e.g., 206-1 to 206-P) can sense a data value (e.g., a logic "1" or "0") stored in a memory cell (e.g., 260-1 to 260-N) by amplifying a differential signal (e.g., voltage or current) on the complementary sense lines (e.g., 205-1 to 205-M) responsive to activation of a selected row line (e.g., 204). As an example, the sense amps 206-1 to 206-P can drive one of the sense lines (e.g., D) of the pair of complementary sense lines 205-1 to a first value (e.g., to a supply voltage such as Vcc), and the other sense line (D_) of the pair of complementary sense lines 205-1 to a second value (e.g., to a reference voltage such as a ground voltage). In this manner, the data value stored by the memory cell (e.g., 260-1) can be determined based on which of the sense lines of the complementary sense line pair is driven to Vcc, for instance. The voltages of the complementary sense line pairs 205-1 to 205-M can then be selectively transferred to the IO lines 266-1 and 266-2 via activation of the column decode lines 264-1 to 264-R. In this manner, the data sensed by the sense amps 206-1 to 206-P can be transferred to the SSA 268 via IO lines 266-1 and 266-2. Often, the SSA 268 may only be capable of storing a data value from a single cell (e.g., one of cells 260-1 to 260-N) at a particular time. As such, if it is desired to transfer the data stored in cell 260-1 to the SSA 268, then column decode line 264-1 would be activated, and if it is desired to transfer the data stored in cell 260-N to the SSA 268, then column decode 264-R would be activated. If both lines 264-1 and 264-R were activated, the SSA 268 may not be able to determine the actual stored data values stored in either of the cells.

However, in various instances, it can be useful to selectively activate more than one of the column decode lines (e.g., 264-1 to 264-R). For example, selectively activating a number of column decode lines can be done in association with performing a compare operation in accordance with a number of embodiments described herein. For instance, in a number of embodiments of the present disclosure, the data path portion shown in FIG. 2 can be operated to determine whether data stored in a memory array (e.g., array 130) matches a compare value, which may be provided by an on-die control circuit (e.g., control circuitry 140) and/or by external control circuitry (e.g., host 110) as part of an "if-then-else" programmatic flow, for example.

In a number of embodiments, control circuitry (e.g., 140 in FIG. 1) can be configured to charge (e.g., precharge) an IO line (e.g., 266-1) to a voltage (e.g., a precharge voltage). For example, the IO line 266-1 can be precharged to a voltage (e.g., a supply voltage such as Vcc) corresponding to a logic "1." The control circuitry can be configured to selectively activate row lines (e.g., a row line including memory cells 260-1, . . . , 260-N) and column decode lines (e.g., CD-1, . . . , CD-R). Sensing circuitry (e.g., 150 in FIG. 1) can be configured to sense a number of selected memory cells (e.g., 260-1, . . . , 260-N) coupled to an activated row line. The sensing circuitry can be configured to determine whether the precharge voltage of the IO line 266-1 changes in response to selective activation of column decode lines CD-1 to CD-R.

In a number of embodiments, the control circuitry (e.g., 140 in FIG. 1) can, in conjunction with the sensing circuitry, can be used to perform a compare function (e.g., to determine if data stored in the memory array matches a compare value). As an example, the IO line 266-1 can be precharged to a particular voltage. The particular voltage can be a voltage corresponding to a data value. For instance the precharge voltage can be a supply voltage such as Vcc, which may correspond to a logic "1," or a ground voltage, which may correspond to a logic "0."

Activation of column decode line CD-1 turns on transistors 218-1 and 218-2, which provides voltages corresponding to the data stored in sense amp 206-1 to IO lines 266-1 and 266-2. As such, the precharge voltage of IO line 266-1 can change based on the particular data value stored in sense amp 206-1 (which represents the data stored in a particular memory cell such as cell 260-1). For example, if the sense amplifier 206-1 senses a logic 0 (e.g., a ground voltage) stored in cell 260-1, then the precharge voltage (e.g., Vcc) on the IO line 266-1 will be pulled down (e.g., lowered) when CD-1 is activated, and the change in the precharge voltage change can be detected by the SSA 268. As such, the detected change in the precharge voltage indicates that the sensed memory cell (e.g., 260-1) stores a data value (e.g., 0) different from the data value (e.g., 1) corresponding to the precharge voltage. Similarly, if the sense amplifier 206-1 senses a logic 1 (e.g., Vcc) stored in cell 260-1, then the precharge voltage (e.g., Vcc) on the IO line 266-1 will not be pulled down when CD-1 is activated, and no change in the precharge voltage will be detected by the SSA 268. As such, no detected change in the precharge voltage indicates that the sensed memory cell (e.g., 260-1) stores the same data value (e.g., 1) as the data value (e.g., 1) corresponding to the precharge voltage.

The above described ability of the SSA 268 to determine whether the precharge voltage changes can be used to perform compare functions to determine whether a particular compare value matches data stored in a memory array, for instance. As an example, if an operation requires knowledge of whether a number of cells coupled to a particular row line stores a particular compare value (e.g., 0), the particular row line can be activated along with the sense lines corresponding the number of memory cells. If any of the cells store a 0, then the precharge voltage of the IO line (e.g., local IO line) will be changed (e.g., pulled down). The result of the operation can be reported, for instance, to the requesting control circuitry (e.g., on-die controller, host, etc.). The result of the operation can be reported into the memory array for further calculations. The determined result may be used as part of continued execution of a particular algorithm. For instance, execution may include not only determining if any of the memory cells of the row store a data value (e.g., 0), but which cell(s) store the data value. As such, subsets of the column decode lines may be selectively activated to compare the data values stored by their corresponding cells to the compare value, which can be used in association with binary searching, for instance.

The compare values used in association with compare operations can be requested by control circuitry coupled to the sense circuitry (e.g., on-die controller) and/or by a number of other sources such as an external host, for instance. Similarly, results of compare operations can be reported to various control circuitry and/or used to perform further operations (e.g., logic operations) as part of if-then-else programmatic flow prior to being reported to control circuitry.

Figure 3:
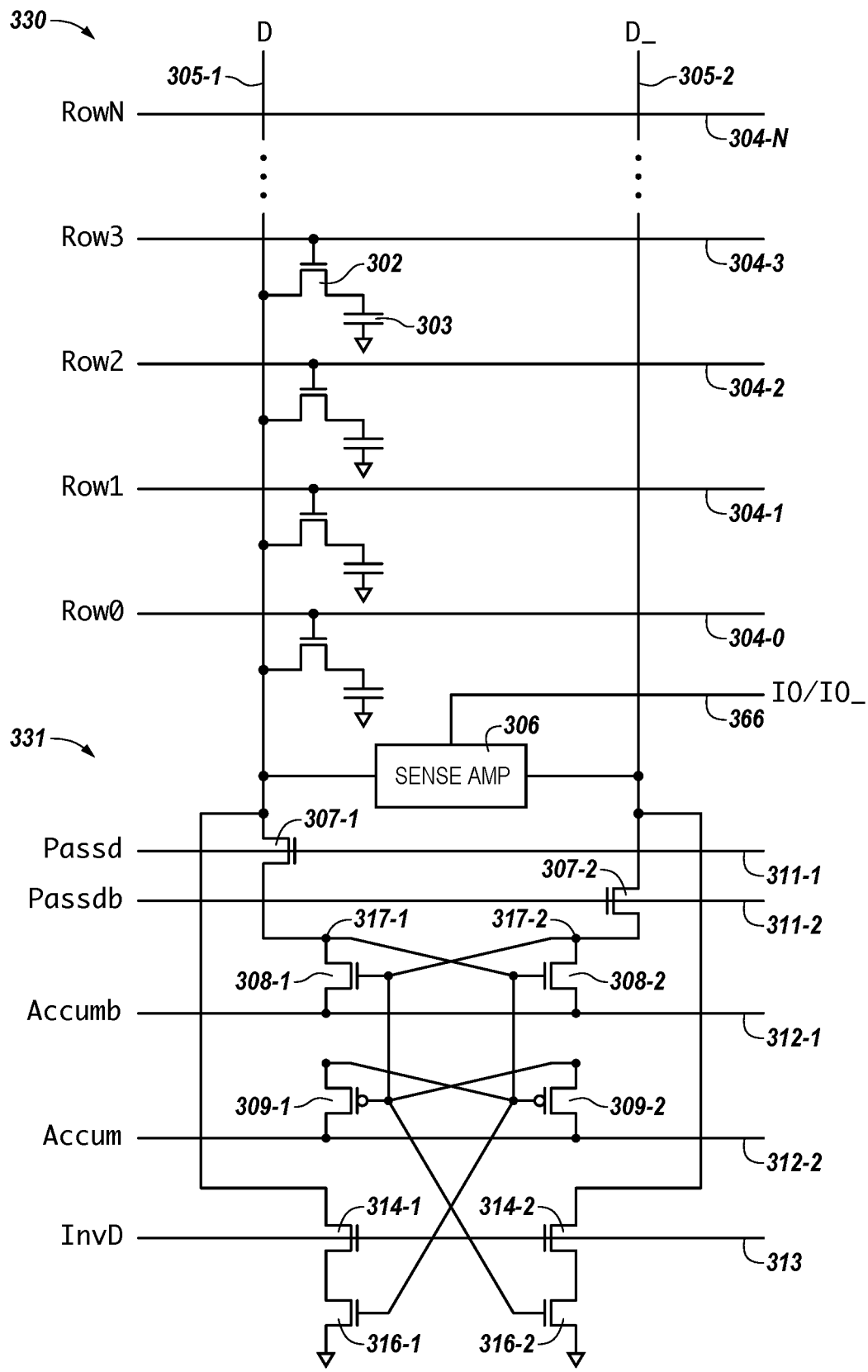
FIG. 3 illustrates a schematic diagram of a portion of a memory array coupled to sensing circuitry in accordance with a number of embodiments of the present disclosure.

FIG. 3 illustrates a schematic diagram of a portion of a memory array 330 coupled to sensing circuitry in accordance with a number of embodiments of the present disclosure. In this example, the memory array 330 is a DRAM array of 1T1C (one transistor one capacitor) memory cells each comprised of an access device 302 (e.g., transistor) and a storage element 303 (e.g., a capacitor). In a number of embodiments, the memory cells are destructive read memory cells (e.g., reading the data stored in the cell destroys the data such that the data originally stored in the cell is refreshed after being read). The cells of array 330 are arranged in rows coupled by word lines 304-0 (Row0), 304-1 (Row1), 304-2, (Row2) 304-3 (Row3), . . . , 304-N (RowN) and columns coupled by sense lines (e.g., digit lines) 305-1 (D) and 305-2 (D_). In this example, each column of cells is associated with a pair of complementary sense lines 305-1 (D) and 305-2 (D_). Although only a single column of memory cells is illustrated in FIG. 3, embodiments are not so limited. For instance, a particular array may have a number of columns of memory cells and/or sense lines (e.g., 4,096, 8,192, 16,384, etc.). A gate of a particular memory cell transistor 302 is coupled to its corresponding word line 304-0, 304-1, 304-2, 304-3, . . . , 304-N, a first source/drain region is coupled to its corresponding sense line 305-1, and a second source/drain region of a particular memory cell transistor is coupled to its corresponding capacitor 303. Although not illustrated in FIG. 3, the sense line 305-2 may also be coupled to a column of memory cells.

The array 330 is coupled to sensing circuitry in accordance with a number of embodiments of the present disclosure. In this example, the sensing circuitry comprises a sense amplifier 306 and a compute component 331. The sensing circuitry can be sensing circuitry 150 shown in FIG. 1. The sense amplifier 306 is coupled to the complementary sense lines D, D_ corresponding to a particular column of memory cells. The sense amp 306 can be operated to determine a state (e.g., logic data value) stored in a selected cell. Embodiments are not limited to the example sense amplifier 306. For instance, sensing circuitry in accordance with a number of embodiments described herein can include current-mode sense amplifiers and/or single-ended sense amplifiers (e.g., sense amplifiers coupled to one sense line).

In a number of embodiments, a compute component (e.g., 331) can comprise a number of transistors formed on pitch with the transistors of the sense amp (e.g., 306) and/or the memory cells of the array (e.g., 330), which may conform to a particular feature size (e.g., $4F^2$, $6F^2$, etc.). As described further below, the compute component 331 can, in conjunction with the sense amp 306, operate to perform various compare and report operations using data from array 330 as input and store the result back to the array 330 without transferring the data via a sense line address access (e.g., without firing a column decode signal such that data is transferred to circuitry external from the array and sensing circuitry via local I/O lines (e.g., 266-1 in FIG. 2).

In the example illustrated in FIG. 3, the circuitry corresponding to compute component 331 comprises five transistors coupled to each of the sense lines D and D_; however, embodiments are not limited to this example. Transistors 307-1 and 307-2 have a first source/drain region coupled to sense lines D and D_, respectively, and a second source/drain region coupled to a cross coupled latch (e.g., coupled to gates of a pair of cross coupled transistors, such as cross coupled NMOS transistors 308-1 and 308-2 and cross coupled PMOS transistors 309-1 and 309-2. As described further herein, the cross coupled latch comprising transistors 308-1, 308-2, 309-1, and 309-2 can be referred to as a secondary latch (the cross coupled latch corresponding to sense amp 306 can be referred to herein as a primary latch).

The transistors 307-1 and 307-2 can be referred to as pass transistors, which can be enabled via respective signals 311-1 (Passd) and 311-2 (Passdb) in order to pass the voltages or currents on the respective sense lines D and D_ to the inputs of the cross coupled latch comprising transistors 308-1, 308-2, 309-1, and 309-2 (e.g., the input of the secondary latch). In this example, the second source/drain region of transistor 307-1 is coupled to a first source/drain region of transistors 308-1 and 309-1 as well as to the gates of transistors 308-2 and 309-2. Similarly, the second source/drain region of transistor 307-2 is coupled to a first source/drain region of transistors 308-2 and 309-2 as well as to the gates of transistors 308-1 and 309-1.

A second source/drain region of transistor 308-1 and 308-2 is commonly coupled to a negative control signal 312-1 (Accumb). A second source/drain region of transistors 309-1 and 309-2 is commonly coupled to a positive control signal 312-2 (Accum). The Accum signal 312-2 can be a supply voltage (e.g., Vcc) and the Accumb signal can be a reference voltage (e.g., ground). Enabling signals 312-1 and 312-2 activates the cross coupled latch comprising transistors 308-1, 308-2, 309-1, and 309-2 corresponding to the secondary latch. The activated sense amp pair operates to amplify a differential voltage between common node 317-1 and common node 317-2 such that node 317-1 is driven to one of the Accum signal voltage and the Accumb signal voltage (e.g., to one of Vcc and ground), and node 317-2 is driven to the other of the Accum signal voltage and the Accumb signal voltage. As described further below, the signals 312-1 and 312-2 are labeled "Accum" and "Accumb" because the secondary latch can serve as an accumulator while being used to perform a logical operation. In a number of embodiments, an accumulator comprises the cross coupled transistors 308-1, 308-2, 309-1, and 309-2 forming the secondary latch as well as the pass transistors 307-1 and 308-2. As described further herein, in a number of embodiments, a compute component comprising an accumulator coupled to a sense amplifier can be configured to perform a logical operation that comprises performing an accumulate operation on a data value represented by a signal (e.g., voltage or current) on at least one of a pair of complementary sense lines.

The compute component 331 also includes inverting transistors 314-1 and 314-2 having a first source/drain region coupled to the respective digit lines D and D_. A second source/drain region of the transistors 314-1 and 314-2 is coupled to a first source/drain region of transistors 316-1 and 316-2, respectively. The gates of transistors 314-1 and 314-2 are coupled to a signal 313 (InvD). The gate of transistor 316-1 is coupled to the common node 317-1 to which the gate of transistor 308-2, the gate of transistor 309-2, and the first source/drain region of transistor 308-1 are also coupled. In a complementary fashion, the gate of transistor 316-2 is coupled to the common node 317-2 to which the gate of transistor 308-1, the gate of transistor 309-1, and the first source/drain region of transistor 308-2 are also coupled. As such, enabling signal InvD serves to invert the data value stored in the secondary latch and drives the inverted value onto sense lines 305-1 and 305-2.

In a number of embodiments of the present disclosure, a compare operation can include activating a row of memory cells (e.g., row line 204) to determine if there is a match in the row line (e.g., at least one memory cell stores a compare value). A compare operation can be expanded to include comparing a 32-bit compare value to data stored in the array. For example, compare values of a number of memory cells can be aggregated in an accumulator (as described above) to determine if there is a collection of compare values that match a 32-bit compare value.

Embodiments of the present disclosure are not limited to the particular sensing circuitry configuration illustrated in FIGS. 2 and 3. For instance, different compute component circuitry can be used to perform logical operations in accordance with a number of embodiments described herein.

Figure 4:
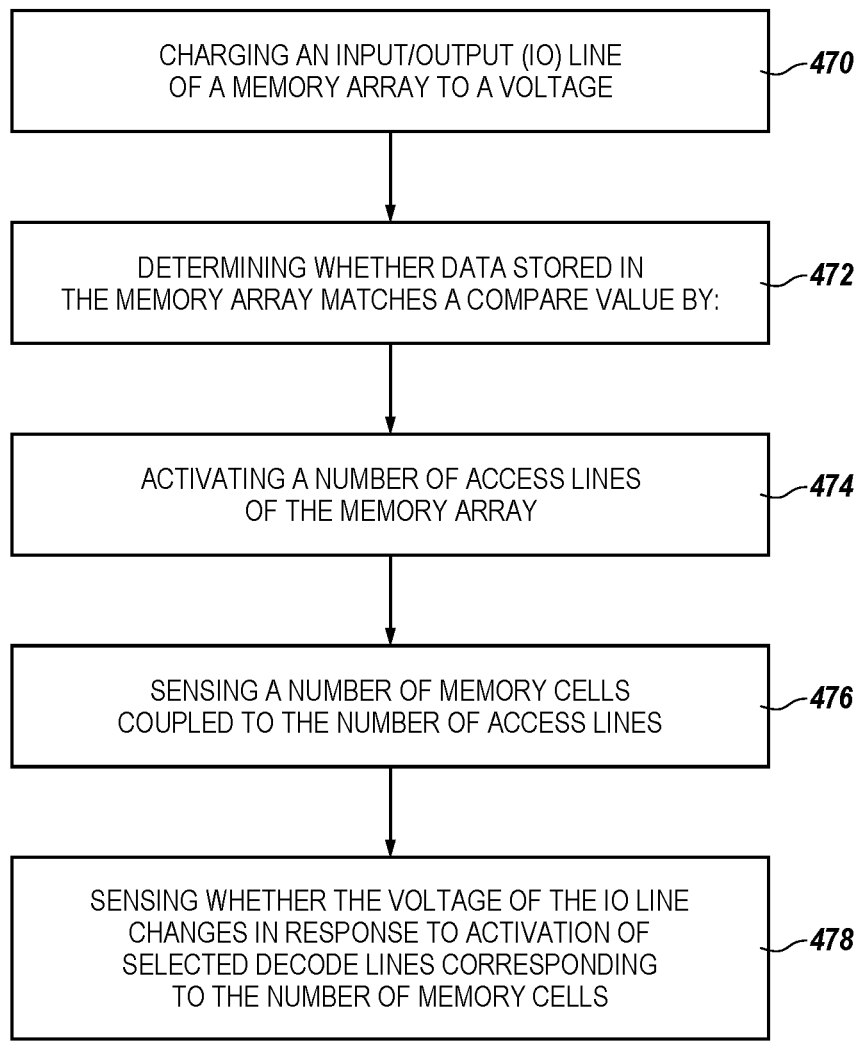
FIG. 4 illustrates an example of a method for performing a compare operation in accordance with a number of embodiments of the present disclosure.

FIG. 4 illustrates an example of a method for performing a compare operation in accordance with a number of embodiments of the present disclosure. At block 470, the method includes precharging an input/output (IO) line (e.g., 266-1 in FIG. 2) of a memory array (e.g., 330 in FIG. 3) to a precharge voltage. The IO line (e.g., a local IO line) can be precharged, for instance, to a voltage corresponding to a particular data value, such as a supply voltage (e.g., Vcc corresponding to logic 1) or a reference voltage (e.g., a ground voltage corresponding to logic 0). A number of embodiments can include precharging a LIO_line (e.g., 266-2 in FIG. 2) of a memory array to a precharge voltage. The voltage to which the LIO_line is precharged can be an inverse of a voltage to which the LIO line is precharged.

At block 472, the method includes determining whether data stored in the memory array matches a compare value. The compare value can be a value provided by an external host (e.g., an external processor) and/or an on die controller. The compare value can include a number of different data values that the control circuitry is attempting to determine whether are stored in at least one memory cell in a memory array. The compare value can be stored in a number of memory cells. For example, the data can be stored in one, two, three, etc., memory cells. A match can refer to a determination that a compare value provided by the control circuitry is stored in at least one memory cell of the array. A determination that the compare value is not stored in at least one memory cell can indicate that there is not a match.

The determination of whether data stored in the memory array matches a compare value can be determined, at block 474, by activating a number of row lines of the memory array. The number of row lines can be selectively activated based on a characteristic of the row lines. The number of row lines can include particular row lines that are predetermined by a controller (e.g., an external host, an on-die controller).

The determination of whether data stored in the memory array matches a compare value can be determined, at block 476, by sensing a number of memory cells coupled to the number of row lines. The voltage of the memory cells of the row lines of the memory array can be sensed by the sense amplifiers and column decode lines can be activated to provide the voltage of the sense amplifers (and corresponding memory cells) to the LIO line.

The determination of whether data stored in the memory array matches a compare value can be determined, at block 478, by sensing whether the precharge voltage of the LIO line changes in response to activation of selected column decode lines corresponding to the number of memory cells. For example, the LIO line can be precharged to a supply voltage (e.g., Vcc) corresponding to a logic 1. A memory cell in the memory array may store a data value (e.g., logic 0) corresponding to a compare value that a controller is trying to locate (e.g., match). When the memory cell is activated and the voltage of the cell is provided to the LIO line (e.g., via the corresponding sense amp), the voltage on the LIO line (e.g., precharge voltage) will drop if the data value stored by the cell matches the compare value (e.g., if the data value stored by the cell is a logic 0). The secondary sense amplifier can detect the drop in voltage and determine that a match has occurred. The determination of the match can be reported to circuitry that provided the compare value (e.g., an on die controller, an external host, etc.) and/or to some other control circuitry for further use. If a match is determined, further operations can be performed to determine a particular location (e.g., cell or cells) within the array where the match occurs. Peripheral control logic can read a data path to determine the compare state of the memory array. Locating the match can include a search method (e.g., a binary search) to determine which memory cell in the memory array matched. The match can occur at a number of memory cells (e.g, no memory cell, one memory cell, or a plurality of memory cells).

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A system, comprising:
a host; and
a memory device coupled to the host and configured to, responsive to an instruction received from the host, perform a compare operation by:
charging an input/output (IO) line coupled to an array of memory cells of the memory device to a voltage; and
determining whether the voltage of the IO line changes in response to activation of a number of selected decode lines and a number of access lines corresponding to a number of memory cells of the memory array.

2. The system of claim 1, wherein the memory device is configured to perform the compare operation without transferring data values stored in the array to the host.

3. The system of claim 1, wherein the instruction is provided from the host in association with an if-then-else programmatic flow, and wherein the memory device is configured to provide a result of the compare operation to the host.

4. The system of claim 1, wherein performing the compare operation includes activation of the number of selected decode lines in succession, and wherein the determination of whether the voltage of the IO line changes occurs during the successive activation of the number of selected decode lines without re-charging the IO line to the voltage.

5. The system of claim 1, wherein the memory device is configured to send an indication that at least one of the number of memory cells stores a compare value in response to the voltage of the IO line changing.

6. The system of claim 5, wherein the indication that the at least one of the number of memory cells stores the compare value is used by the host to instruct the memory device to perform a number of logical operations within the memory device.

7. The system of claim 1, further comprising control circuitry configured to decode signals provided by a control bus from the host.

8. The system of claim 1, wherein the system is a server.

9. The system of claim 1, wherein the host includes a processing resource configured to generate the instructions.

10. The system of claim 9, wherein the processing resource comprises at least one of a host processor and a controller.

11. The system of claim 9, wherein the processing resource is configured to perform logical operations.

12. A system, comprising:
a host; and
a memory device coupled to the host, wherein the memory device is configured to cause, in association with executing a compare and report instruction received from the host:
charging of an input/output (IO) line of an array of memory cells to a voltage;
sensing of whether the voltage of the IO line changes in response to activation of a number of selected decode lines of the array corresponding to a number of memory cells in the array to determine whether data stored in the number of memory cells matches a compare value; and
reporting of a result of the sensing of whether the voltage of the IO line changes to at least one of control circuitry of the memory device and the host.

13. The system of claim 12, wherein the control circuitry comprises one of a state machine and a sequencer.

14. The system of claim 12, wherein the host comprises a motherboard and/or a backplane.

15. The system of claim 12, wherein the host and the memory device are on a same integrated circuit.

16. A method, comprising:
receiving at a memory device, and from a host, a request to perform a compare function;
in response to receiving the request, determining whether a voltage of an input/output (IO) line of a memory array changes in response to activation of a number of selected decode lines and a number of access lines corresponding to memory cells of the memory array;
in response to determining that the voltage of the IO line changes, determining that at least one of the memory cells of the memory array stores a compare value.

17. A method, comprising:
receiving at a memory device, and from a host, a request to perform a compare function;
in response to receiving the request, determining whether a voltage of an input/output (IO) line of a memory array changes in response to activation of a number of selected decode lines and a number of access lines corresponding to memory cells of the memory array; and
sending a result of the determination to at least one of the host and control circuitry.

18. The method of claim 17, further comprising receiving an instruction from the host indicating to perform a number of logical operations in the memory device based on the result of the determination.

* * * * *